(12) United States Patent
Kato

(10) Patent No.: US 7,218,055 B2
(45) Date of Patent: May 15, 2007

(54) DISCHARGE LAMP LIGHTING APPARATUS

(75) Inventor: Koichi Kato, Toyoake (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/043,109

(22) Filed: Jan. 27, 2005

(65) Prior Publication Data
US 2005/0168173 A1 Aug. 4, 2005

(30) Foreign Application Priority Data
Feb. 4, 2004 (JP) .............................. 2004-027559

(51) Int. Cl.
*H01J 7/44* (2006.01)
(52) U.S. Cl. ........................................ 315/57; 361/623
(58) Field of Classification Search ................ 315/56, 315/209 R, 224–225, 291, 307, 57, 77, 82; 361/600, 622, 623, 674, 679, 807, 808, 836
See application file for complete search history.

(56) References Cited
U.S. PATENT DOCUMENTS 3,219,749 A * 11/1965 Schuster et al. ............ 174/266
3,344,515 A * 10/1967 Schuster et al. ............... 29/852
4,858,071 A * 8/1989 Manabe et al. ............. 361/720
5,124,888 A * 6/1992 Suzuki et al. ............... 361/740
5,939,835 A * 8/1999 Takeda et al. .......... 315/209 R
6,066,921 A * 5/2000 Nakamura et al. ............ 315/71
6,201,350 B1 * 3/2001 Okuchi et al. ................ 315/82
6,642,668 B2 * 11/2003 Toyama et al. ............. 315/224
6,943,502 B2 * 9/2005 Yamanaka et al. .......... 315/224
2002/0127379 A1 * 9/2002 Suzuki et al. ............... 428/209

FOREIGN PATENT DOCUMENTS

JP 2000-156294 6/2000

* cited by examiner

*Primary Examiner*—Thuy Vinh Tran
(74) *Attorney, Agent, or Firm*—Posz Law Group, PLC

(57) ABSTRACT

The discharge lamp lighting apparatus includes a power section operating to generate a high voltage to be applied to a discharge lamp to trigger electrical discharge within the discharge lamp and to generate an AC voltage to be supplied to the discharge lamp to keep the discharge lamp in a stable lighting state, and a control section controlling operation of the power section. The power section and the control section are installed separately within an enclosure of the discharge lamp lighting apparatus.

9 Claims, 6 Drawing Sheets

DISCHARGE LAMP LIGHTING APPARATUS

CROSS-REFERENCE TO RELATED APPLICATION

This application is related to Japanese Patent Application No. 2004-27559 filed on Feb. 4, 2004, the contents of which are hereby incorporated by reference.

FIELD OF THE INVENTION

The present invention relates to a discharge lamp lighting apparatus for lighting a high-pressure discharge lamp such as a vehicle headlight.

DESCRIPTION OF RELATED ART

As disclosed in Japanese Patent Application Laid-open No. 2000-156294, for example, to turn on a high-pressure discharge lamp, a high voltage generated by use of a starter transformer is applied to the high-pressure discharge lamp in order that a capacitive discharge occurs between the electrodes of the discharge lamp thereby forming an arc therebetween. After that, the discharge lamp is shifted to a stable lighting state.

Generally, the lighting apparatus of this type has a metal casing containing a printed circuit board and a bus-bar casing mounted on this printed circuit board. This bus-bar casing contains a bus bar, and circuit parts including a starter transformer having a high-voltage coil, inductors, a thyristor and capacitors. Connecting pads formed on the printed circuit board are electrically connected with the terminals of the circuit parts within the bus-bar casing by ribbon wires or the likes.

Attempts have been made to reduce the overall size of such a lighting apparatus. However, the results fall short of expectations. The reasons for this are explained below.

First, the circuit elements of the lighting apparatus have to be laid out on the printed circuit board such that a space large enough is provided above the connecting pads and above the terminals of the circuit parts within the bus-bar casing, because the ribbon wires are welded to the connecting pads and the terminals by use of a laser-beam welder during the manufacturing process of the lighting apparatus. It becomes a constraint in the size reduction of the lighting apparatus.

Secondary, if the circuit elements such as ICs and a high voltage cable are located closely within the metal casing, there arises a noise on the circuits of the lighting apparatus. This also becomes a constraint in the size reduction of the lighting apparatus.

SUMMARY OF THE INVENTION

In one aspect of the invention, the discharge lamp lighting apparatus has a structure including:

a starter circuit generating a high voltage to be applied to a discharge lamp for triggering electric discharge within the discharge lamp to light up the discharge lamp;

an inverter circuit generating an AC voltage to be supplied to the discharge lamp once lit up;

a control circuit controlling the inverter circuit and the starter circuit for lighting up the discharge lamp and keeps the discharge lamp in a stable lighting state;

an enclosure having a first casing containing the inverter circuit and the control circuit and a second casing containing the starter circuit;

a control circuit board on which circuit elements constituting the control circuit are mounted; and a power circuit board on which circuit elements constituting the inverter circuit are mounted.

The control and power circuit boards are separately installed within the first casing, and the second casing is disposed above the first casing.

With this structure, it becomes possible to reduce the heat transmitting to the control circuit, because the control circuit board is installed separately from the power circuit board within the first casing.

Furthermore, the overall size of the lighting apparatus of the invention can be made far smaller than the prior art lighting apparatus, because the circuit elements constituting the control circuit and circuit parts constituting the starter circuit are disposed one on top of the other.

The control circuit board may be made of a multilayered circuit board on which low heat diffusing elements including an integrated circuit are mounted in high density. In this case, the lighting apparatus can be made even smaller in size.

Preferably, at least a part of the starter circuit is situated above the control circuit board Preferably, connecting pads formed on the power circuit board are arranged in a lump within a predetermined area below the terminals provided in the second casing, so that there is provided an empty space large enough for efficiently carrying out laser beam welding of wires to the connecting pads on the power circuit board and to the terminals provided in the second casing.

The power circuit board may be a single-layer board to reduce manufacturing costs of the lighting apparatus.

A relative large transformer for DC-DC conversion for obtaining the DC voltage to be supplied to the inverter circuit may be mounted on the control circuit board. In this case, the second casing can be made smaller in size than a prior art bus-bar casing (corresponding to the second casing) that contains the transformer for the DC-DC conversion.

Preferably, the control and power circuit boards are fitted apart from each other on the inner surface of the bottom of the first casing, and terminals formed on the control circuit board and terminals formed on the power circuit board are connected by wire bonding for electrically connecting the control circuit with the inverter circuit. In this case, the heat of the power circuit board does not transmit much to the control circuit board, and accordingly circuit elements susceptible to heat such as MICs (Monolithic Integrated Circuits) can operate in a higher temperature environment.

Preferably, the second casing is frame-like, a starter transformer generating the high voltage of the starter circuit is arranged so as to occupy an empty space alongside the control and power circuit boards within the first casing, and the high voltage is supplied to the discharge lamp by a high voltage cable which is connected to the starter transformer at one end thereof, routed along an inner surface of the frame of the second casing, and is connected to the discharge lamp at the other end thereof.

With this configuration, circuit elements mounted on the control circuit board susceptible to magnetic noise such as the MICs can be relatively distant from the starter transformer and the high voltage cable, so that they can operate without being affected by the magnetic noise.

In another aspect of the invention, the discharge lamp lighting apparatus has a structure including:

a power section operating to generate a high voltage to be applied to a discharge lamp to trigger electrical discharge within the discharge lamp and to generate an AC voltage to be supplied to the discharge lamp to keep the discharge lamp in a stable lighting state; and a control section controlling operation of the power section;

wherein the power section and the control section are installed separately within an enclosure of the discharge lamp lighting apparatus.

With this structure, it becomes possible to reduce the heat transmitting to the control section from the power section, because the power section and the control section are installed separately within an enclosure of the discharge lamp lighting apparatus.

The control section may be mounted on a control circuit board made of a multilayered circuit board, so that the overall size of the lighting apparatus of the invention can be made smaller.

PREFERRED EMBODIMENTS OF THE INVENTION

Figure 1:
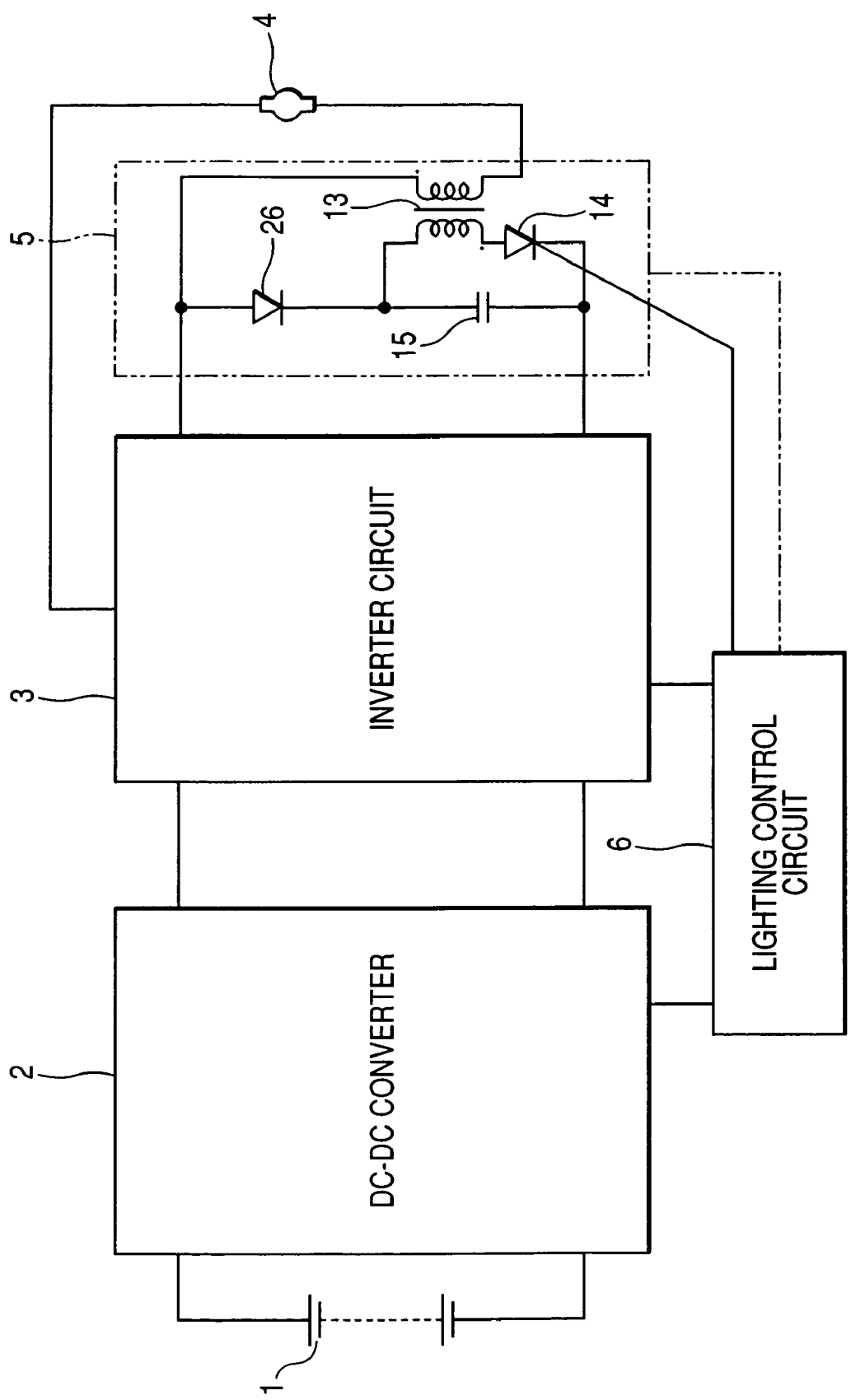
FIG. 1 is a block diagram showing a structure of a discharge lamp lighting apparatus according to an embodiment of the invention.

FIG. 1 is a block diagram schematically showing a structure of a discharge lamp lighting apparatus according to an embodiment of the invention. As shown in FIG. 1, the lighting apparatus includes a DC-DC converter 2 for stepping up the voltage of a battery 1, an inverter circuit 3 for converting the stepped-up DC voltage into an AC voltage to be supplied to a discharge lamp 4.

The lighting apparatus further includes a starter circuit 5 constituted by circuit parts including a starter transformer 13, a capacitor 14, a thyristor 15, and a diode 26. The starter circuit 5 is for causing a capacitive discharge between the electrodes of the discharge lamp 4 by applying thereto a high voltage generated by use of the starter transformer 13, thereby forming an arc therebetween. The discharge lamp 4 is shifted to a stable lighting state after the capacitive discharge is caused between the electrodes thereof. The lighting apparatus is provided with a lighting control circuit 6 which detects a current flowing through the discharge lamp 4, and performs a feed-back control on the basis of the detected current in order to keep the discharge lamp 4 in the stable lighting state.

Figure 2:
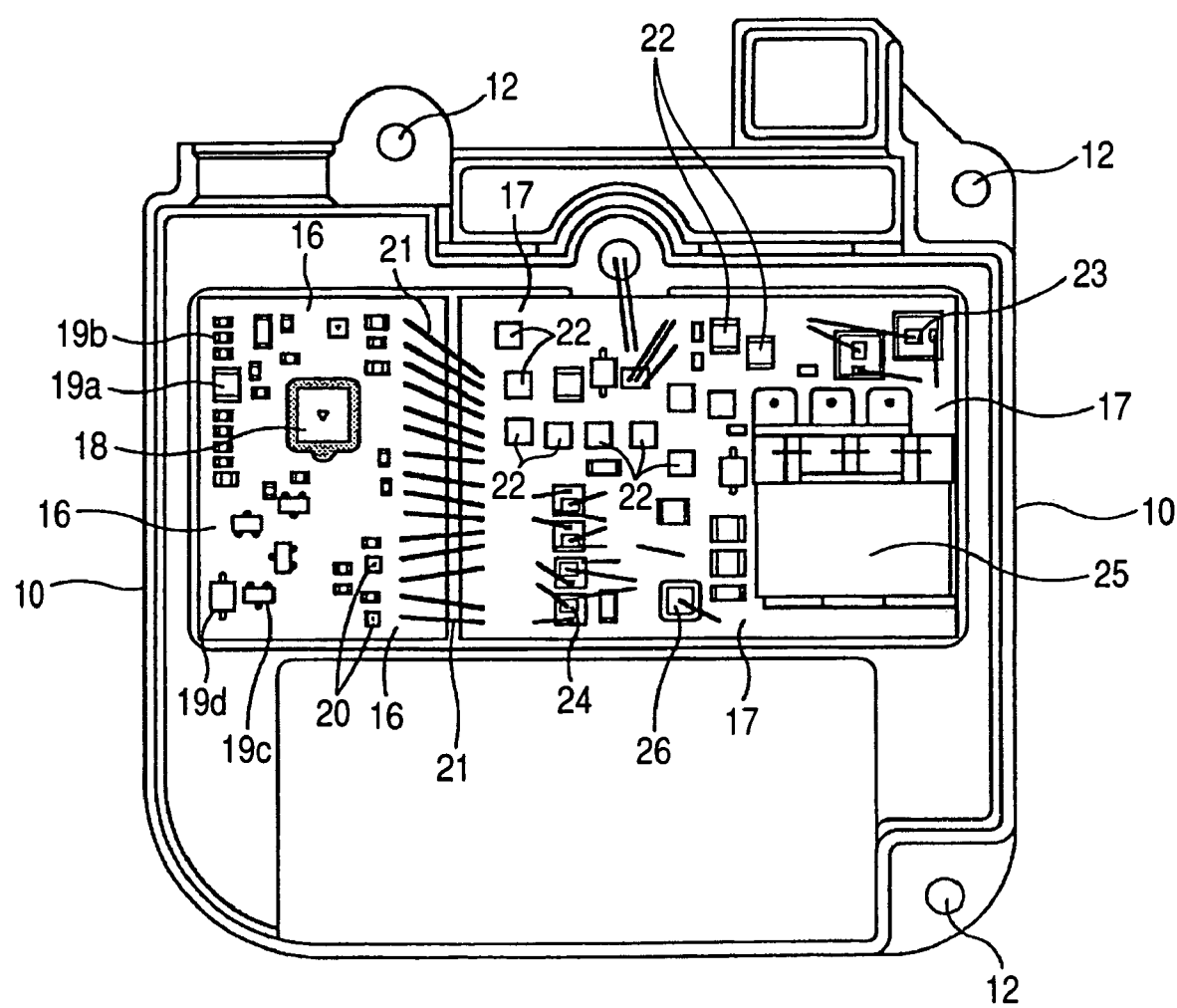
FIG. 2 is a plan view of a metal casing of the lighting apparatus according to the embodiment of the invention, which contains a control circuit board accommodating a control section and a power circuit board accommodating a power section.

As shown in FIGS. 2 to 6, the circuit parts and circuit elements of the lighting apparatus are contained in an enclosure constituted by a metal casing 10, a bus-bar casing 11 and a casing cover (not illustrated). The bus-bar casing 11 is for containing the circuit parts constituting the starter circuit 5. The metal casing 10 has a low-height sidewall, and is open at its top. As shown in FIG. 2, a control circuit board 16 for a control section (including the lighting control circuit 6) and a power circuit board 17 for a power section (including the DC-DC converter 2 and inverter circuit 3) electrically connected with each other by wire bonding 21 are separately bonded to the inner surface of a bottom of the metal casing 10 through insulating layers. The metal casing 10 has mounting sections 12 having mounting holes formed therein at each corner thereof.

The control circuit board 16 is made of a multilayered printed circuit board that has a ceramic board as a base thereof. A conductive pattern is formed on each of the front and rear surfaces of the control circuit board 16. The conductive layers on the front and rear surfaces of the control circuit board 16 are electrically connected with each other by through holes. MICs 18 and 20, a transistor 19c, a resistor 19a, a capacitor 19b, a diode 19d, etc. are mounted on the control circuit board 16 in high density as low-voltage driven and low-heat diffusing circuit elements of the control section. Accordingly, the control circuit board 16 itself has been down-sized substantially.

On the other hand, the power circuit board 17 is made of a single-layer board. The circuit elements of the power section including IGB (Insulated Gate Bipolar) transistors 23, MOS transistors 24, a diode 26, a transformer 25 of the DC-DC converter, each of which is relatively large in size and produces a relatively large amount of heat, are mounted on this power circuit board 17. Connecting pads 22 are also formed on the power circuit board 17. The connecting pads 22 are arranged in a lump within a relatively narrow area on the power circuit board 17.

The bus-bar casing 11 is provided with casing terminals 30 connected to the circuit parts constituting the starter circuit 5. The connecting pads 22 are electrically connected with the casing terminals 30 by ribbon wires 31.

The metal casing 10 has an empty space alongside the control circuit board 16 and the power circuit board 17. The starter transformer 13 within the bus-bar casing 11 occupies this empty space when the bus-bar casing 11 is fitted into the metal casing 10.

Figure 3:
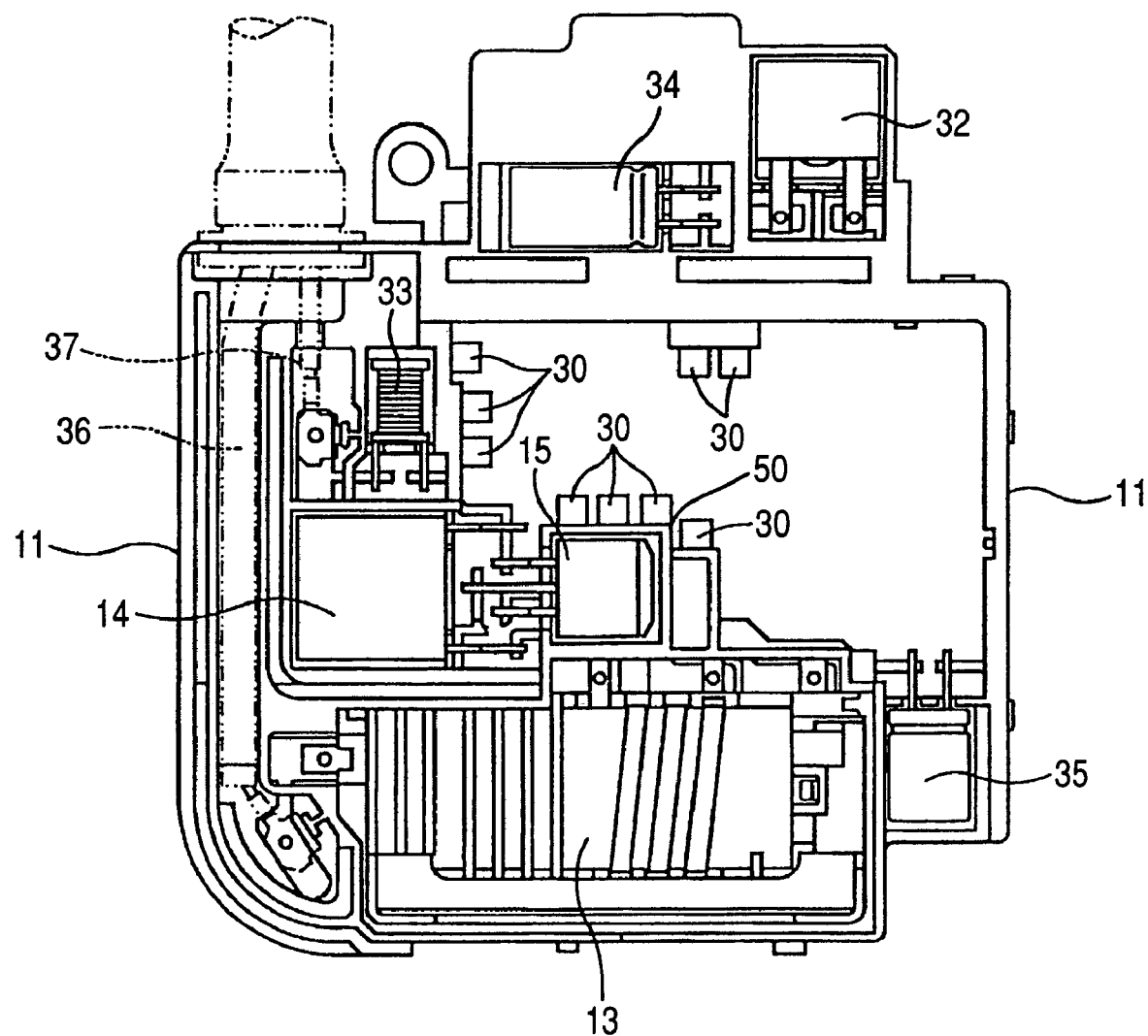
FIG. 3 is a plan view of a bus-bar casing containing circuit parts of the discharge lamp lighting apparatus according to the embodiment of the invention.
Figure 4:
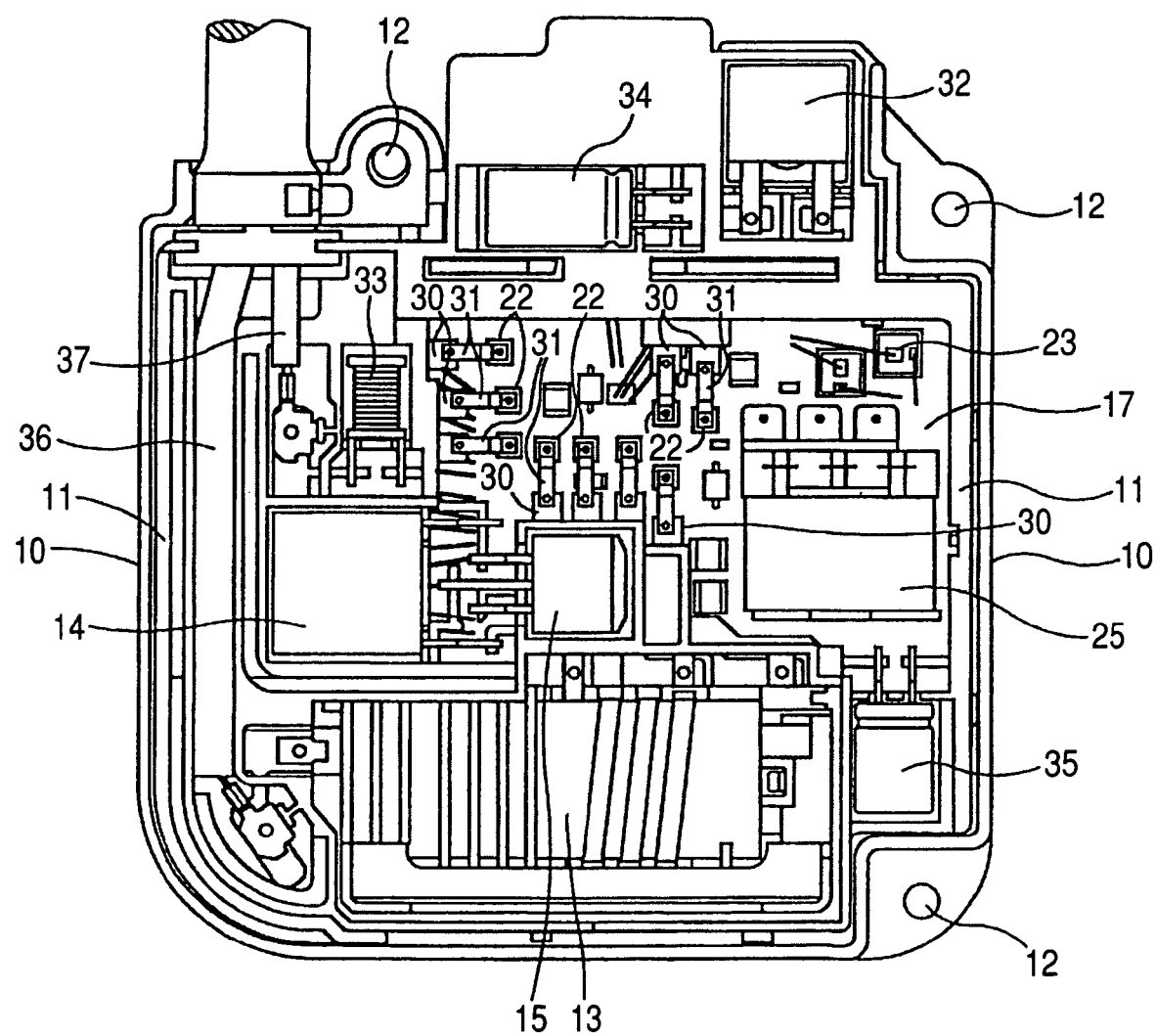
FIG. 4 is a plan view of the metal casing in which the bus bar casing is fitted.

The bus-bar casing 11 is made of a synthetic resin shaped into a frame mountable within the metal casing 10. The casing terminals 30 and a bus bar 50 are provided within the bus-bar casing 11 by insert molding. As shown in FIG. 3, the casing terminals 30 are arranged so as to be situated within an empty space above the control circuit board 17 when the bus-bar casing 11 is fitted into the metal casing 10. This empty space makes it possible to weld the ribbon wires to the connecting pads 22 and to the casing terminals 30 by use of a laser beam welder.

The starter transformer 13 of the starter circuit 5, which occupies the empty space alongside the circuit boards 16, 17 within the metal casing 10 when the bus-bar casing 11 is fitted into the metal casing 10, is connected to a high-voltage cable 36 which is routed along the inner surface of the frame of the bus-bar casing 11 to go to the discharge lamp 4. A low-voltage cable 37 connected to an output-side inductor 33 also goes to the discharge lamp 4 from the bus-bar casing 11 together with the high-voltage cable 36.

A channel is formed in the inner surface of the frame of the bus-bar casing 11 to accommodate therein the high-voltage cable 36. The output-side inductor 33, an input-side inductor 32 electrically connected to the battery 1, electrolytic capacitors 14, 34, 35, and a thyristor 15 are accommodated in their respective compartments provided along the frame of the bus-bar casing 11.

The size of the metal casing 10, that is the overall size of the lighting apparatus according to this embodiment of the invention can be made far smaller than the prior art lighting apparatus, because the circuit parts of the starter circuit 5 such as the capacitor 14, thyristor 15, and inductor 33 are accommodated in the bus-bar casing 11 fitted in the metal casing 10, such that they are situated above the control circuit board 16 and the power circuit board 17 with consideration given to a space needed for carrying out the laser beam welding of the ribbon wires to the connecting pads on the control circuit board 17 and to the casing terminals 30 within the bus-bar casing 11.

Next, how the lighting apparatus having the above-described structure is assembled in a production line is explained below. As for the metal casing 10, the control circuit board 16 and the power circuit board 17, on which the circuit elements of the control section and the circuit elements of the power section have been mounted, respectively, are bonded to predetermined positions on the inner surface of the bottom of the metal casing 10.

As for the bus-bar casing 11, the starter transformer 13, high-voltage cable 36, low-voltage cable 37, input-side inductor 32, output-side inductor 33, electrolytic capacitors 14, 34, 35, and thyristor 15 are set within their compartments provided along the frame of the bus-bar casing 11. Subsequently, their terminals are electrically connected to the bus bar 50 or the casing terminals 30 as necessary.

Figure 5:
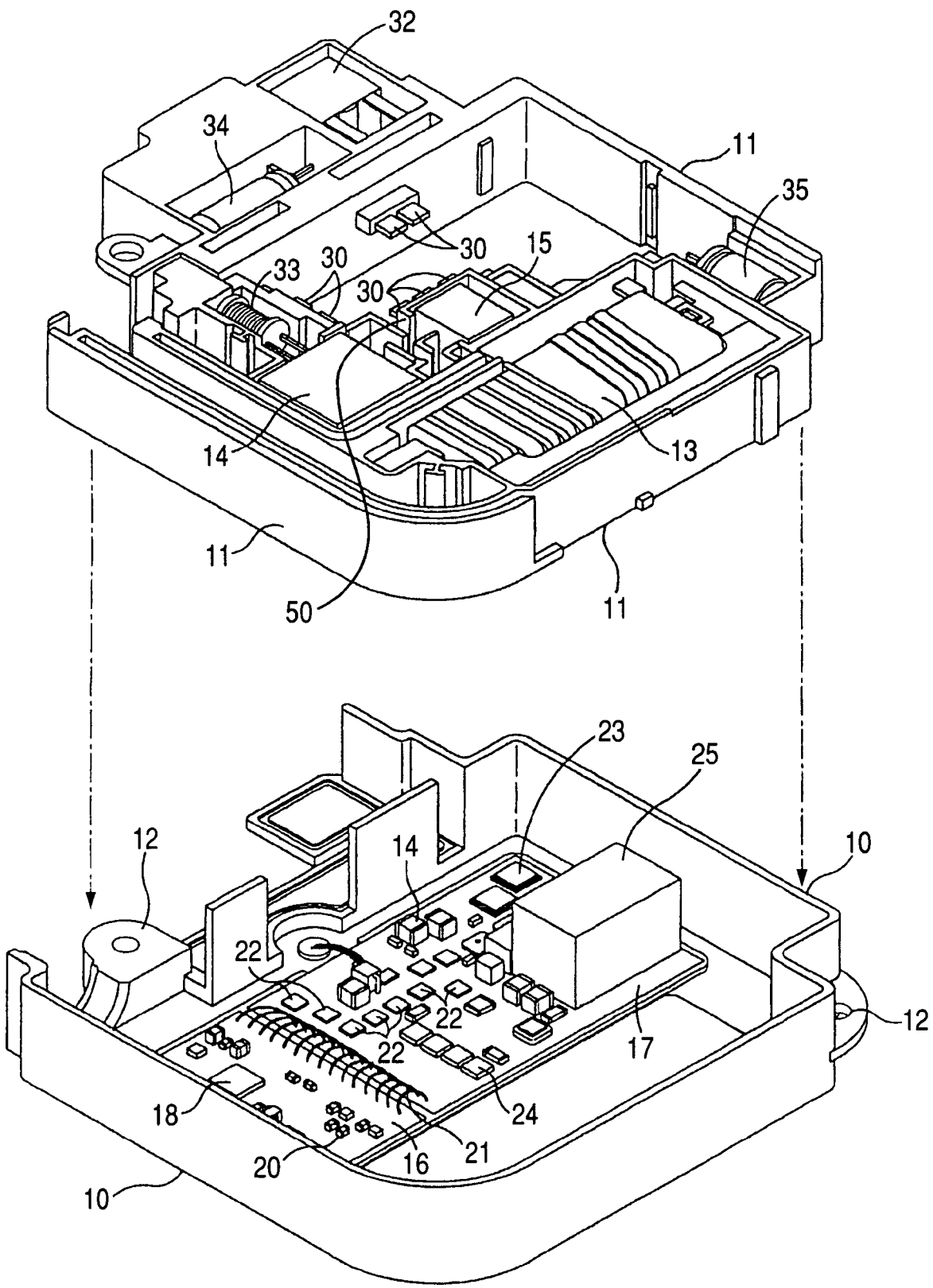
FIG. 5 is an exploded perspective view of the metal casing and the bus-bar casing.
Figure 6:
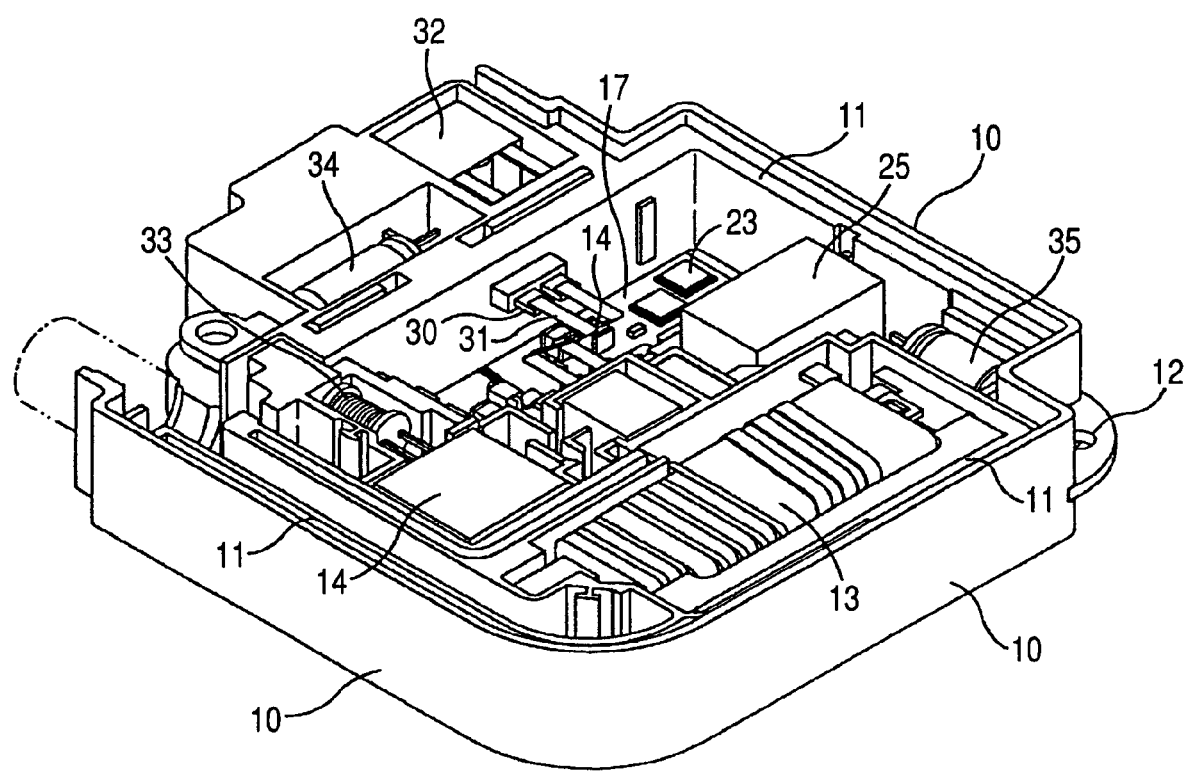
FIG. 6 is an exploded perspective view of the metal casing in which the bus-bar casing is fitted.

Next, the bus-bar casing 11 is fitted into the metal casing 10 as shown in FIGS. 5, 6. After that, the ribbon wires 31 are welded to the connecting pads 22 on the control circuit board 17 and the casing terminals 30 within the bus-bar casing 11 so that each one of the connecting pads 22 is connected to corresponding one of the casing terminals 30. To carry out a laser beam welding, it is necessary to provide, around a welding point, an empty space through which a laser beam from a laser beam welder passes through and hits the welding point. In this embodiment, since such an empty space is provided above the control circuit board 17 on which the connecting pads 22 are formed, the laser beam welding can be performed without any difficulty. Finally, the metal casing 10 is filled with silicon gel, and then covered by a casing cover (not illustrated) to seal the inside of the metal casing 10.

Next, the operation of the lighting apparatus according to this embodiment is briefly explained below. When a power switch (not illustrated) is turned on, the DC-DC converter 2, inverter circuit 3, and lighting control circuit 6 begin to operate. As a result, an AC voltage outputted from the inverter circuit 3 is applied to a capacitor 15 through a diode 26, and the capacitor 15 is charged accordingly. Subsequently, the lighting control circuit 6 outputs a gate drive signal to the thyristor 14 to turn on the thyristor 14. The capacitor 15 begins to discharge at a moment when the thyristor 14 is turned on, and a high voltage is therefore generated across the secondary coil of the starter transformer 13. In consequence, a capacitive discharge between the electrodes of the lamp 4 is triggered, and the lamp 4 lights up accordingly. After that, the lighting control circuit 6 controls the starter circuit 5 to cease the high voltage generating operation, and controls the inverter circuit 3 to keep supplying an AC voltage to the discharge lamp 4 so that the discharge lamp 4 continues to light.

A high voltage pulse arises in the starter transformer 13 and the high voltage cable 36 during this high voltage generating operation. It causes a magnetic noise. However, the circuit elements susceptible to the magnetic noise such as the MICs are mounted on the control circuit board 16 which is relatively distant from the starter transformer 13 and the high voltage cable 36, and accordingly they can operate without being affected by the magnetic noise.

Furthermore, in this embodiment, the circuit board of the lighting apparatus 10 is divided into the control circuit board 16 for the control section and the power circuit board 17 for the power section which are installed apart from each other within the metal casing 10. More specifically, the low-voltage driven and low-heat diffusing circuit elements such as the MICs, HICs (Hybrid Integrated Circuits), transistors, resistors, capacitors are mounted on the control circuit board 16 installed such that a certain space is left with the power circuit board 17 that generates relatively a large amount of heat. Accordingly, the lighting apparatus according to this embodiment of the invention can operate normally in a higher temperature environment.

The above explained preferred embodiments are exemplary of the invention of the present application which is described solely by the claims appended below. It should be understood that modifications of the preferred embodiments may be made as would occur to one of skill in the art.

What is claimed is:

1. A discharge lamp lighting apparatus comprising:
a starter circuit generating a high voltage to be applied to a discharge lamp for triggering electric discharge within said discharge lamp to light up said discharge lamp;
an inverter circuit generating an AC voltage to be supplied to said discharge lamp once lit up;
a control circuit controlling said inverter circuit and said starter circuit for lighting up said discharge lamp and keeps said discharge lamp in a stable lighting state;
an enclosure having a first casing containing said inverter circuit and said control circuit and a second casing containing said starter circuit;
a control circuit board on which circuit elements constituting said control circuit are mounted; and
a power circuit board on which circuit elements constituting said inverter circuit are mounted;
said control and power circuit boards being separately installed within said first casing, said second casing being disposed above said first casing.

2. A discharge lamp lighting apparatus according to claim 1, wherein at least a part of said starter circuit is situated above said control circuit board.

3. A discharge lamp lighting apparatus according to claim 1, wherein connecting pads formed on said power circuit board are connected to terminals provided in said second casing by conductors for electrically connecting said inverter circuit with said starter circuit.

4. A discharge lamp lighting apparatus according to claim 3, wherein said power circuit board is made of a single-layered circuit board on which heat diffusing elements including a power transistor are mounted.

5. A discharge lamp lighting apparatus according to claim 3, wherein said connecting pads are arranged in a lump within a predetermined area on said power circuit board so as to be situated below said terminals provided in said second casing.

6. A discharge lamp lighting apparatus according to claim 1, wherein said control circuit board is made of a multilayered circuit board on which at least an integrated circuit is mounted.

7. A discharge lamp lighting apparatus according to claim 1, further comprising a DC-DC converter having a transformer for stepping up a DC voltage to be supplied to said inverter circuit, said transformer being mounted on said power circuit board.

8. A discharge lamp lighting apparatus according to claim 1, wherein said control and power circuit boards are fitted apart from each other on an inner surface of a bottom of said first casing, and terminals formed on said control circuit board and terminals formed on said power circuit board are connected to each other by wire bonding for electrically connecting said control circuit and said inverter circuit with each other.

9. A discharge lamp lighting apparatus according to claim 1, wherein said second casing is in the form of a frame, and circuit parts constituting said starter circuit includes a starter transformer which generates said high voltage and is arranged so as to occupy an empty space alongside said control and power circuit boards within said first casing, said high voltage being supplied to said discharge lamp by a high voltage cable which is connected to said transformer at one end thereof, routed along an inner surface of a frame of said second casing, and is connected to said discharge lamp at the other end thereof.

* * * * *